United States Patent
Raha

(10) Patent No.: US 6,946,917 B2
(45) Date of Patent: Sep. 20, 2005

(54) GENERATING AN OSCILLATING SIGNAL ACCORDING TO A CONTROL CURRENT

(75) Inventor: Prasun K. Raha, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 113 days.

(21) Appl. No.: 10/722,930

(22) Filed: Nov. 25, 2003

(65) Prior Publication Data

US 2005/0110579 A1 May 26, 2005

(51) Int. Cl.$^7$ .................................................. H03L 7/85
(52) U.S. Cl. ...................................... 331/16; 455/256
(58) Field of Search .................. 331/1 A, 16; 327/156, 327/161; 455/255, 256, 262, 264

(56) References Cited

U.S. PATENT DOCUMENTS

| | | | |
|---|---|---|---|
| 5,331,295 A | * | 7/1994 | Jelinek et al. ................. 331/57 |
| 5,420,547 A | | 5/1995 | Kikuchi |
| 5,635,878 A | | 6/1997 | Liu et al. |
| 6,188,289 B1 | * | 2/2001 | Hyeon ......................... 331/17 |
| 6,215,364 B1 | * | 4/2001 | Hwang et al. ................. 331/57 |
| 6,859,108 B2 | * | 2/2005 | Abbasi et al. ................. 331/17 |
| 6,876,244 B1 | * | 4/2005 | Moraveji ..................... 327/374 |

OTHER PUBLICATIONS

Hiok-Tiaq Ng and David J. Allstot, CMOS Current Steering Logic for Low–Voltage Mixed–Signal Integrated Circuits, IEEE Transactions On Very Large Scale Integration (VLSI) Systems, vol. 5, No. 3, pp. 301–308, Sep. 1997.

Katakura Masayuki, Patent Abstracts of Japan, vol. 1998, No. 01, Jan. 30, 1998, JP 09246922, Publication Date Sep. 19, 1997.

Kurooka Kazuaki, Patent Abstracts of Japan, vol. 2000, No. 23, Feb. 10, 2001, JP 2001156600, Publication Date Jun. 8, 2001.

* cited by examiner

*Primary Examiner*—Timothy P. Callahan
*Assistant Examiner*—An T. Luu
(74) *Attorney, Agent, or Firm*—Alan K. Stewart; W. James Brady, III; Frederick J. Telecky, Jr.

(57) ABSTRACT

Generating an oscillating signal according to a control current includes receiving a control current corresponding to an oscillation frequency. A first differential signal and a second differential signal are generated by switching a first load according to the control current to yield the first differential signal, and switching a second load according to the control current to yield the second differential signal. The first load operates in opposition to the second load.

20 Claims, 5 Drawing Sheets

GENERATING AN OSCILLATING SIGNAL ACCORDING TO A CONTROL CURRENT

TECHNICAL FIELD

This invention relates generally to the field of integrated circuits and more specifically to generating an oscillating signal according to a control current.

BACKGROUND

Oscillators are often used in circuit design to generate signals having specific frequencies. For example, monolithic oscillators may be used for on-chip clock-source generation. Known monolithic oscillators include voltage controlled oscillators with inductance-capacitance (LC) components. Using LC components, however, may result in a large circuit with high power consumption. Other known oscillators include current/voltage controlled oscillators. These known oscillators, however, are sometimes extremely sensitive to external conditions. It is typically desirable for an oscillator to not be extremely sensitive to external conditions.

SUMMARY OF THE DISCLOSURE

In accordance with the present invention, disadvantages and problems associated with previous oscillators may be reduced or eliminated.

According to one embodiment of the present invention, generating an oscillating signal according to a control current includes receiving a control current corresponding to an oscillation frequency. A first differential signal and a complementary second differential signal are generated by switching a first load according to the control current to yield the first differential signal, and switching a second load according to the control current to yield the second differential signal. The first load operates in opposition to the second load.

According to a particular embodiment of the present invention, generating an oscillating signal according to a control current includes receiving a control current corresponding to an oscillation frequency. A first differential signal and a complementary second differential signal are generated by switching a first load according to the control bias current to yield a true differential delay element. A number of delay elements may be coupled in a chain and looped back with a 180 phase inversion to yield a differential oscillation at the output of each delay element. The oscillating signal has a frequency substantially linearly proportional to the control bias current.

Certain embodiments of the invention may provide one or more technical advantages. A technical advantage of one embodiment may be that transistor sets may operate to generate substantially symmetrical differential signals. The substantially symmetrical differential signals may be used to generate an oscillating signal with an accurate 50 percent duty cycle while providing the capability to be generated at as low as 0.5 V.

Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which.

DETAILED DESCRIPTION OF THE DRAWINGS

Embodiments of the present invention and its advantages are best understood by referring to FIGS. 1 through 5 of the drawings, like numerals being used for like and corresponding parts of the various drawings.

Figure 1:
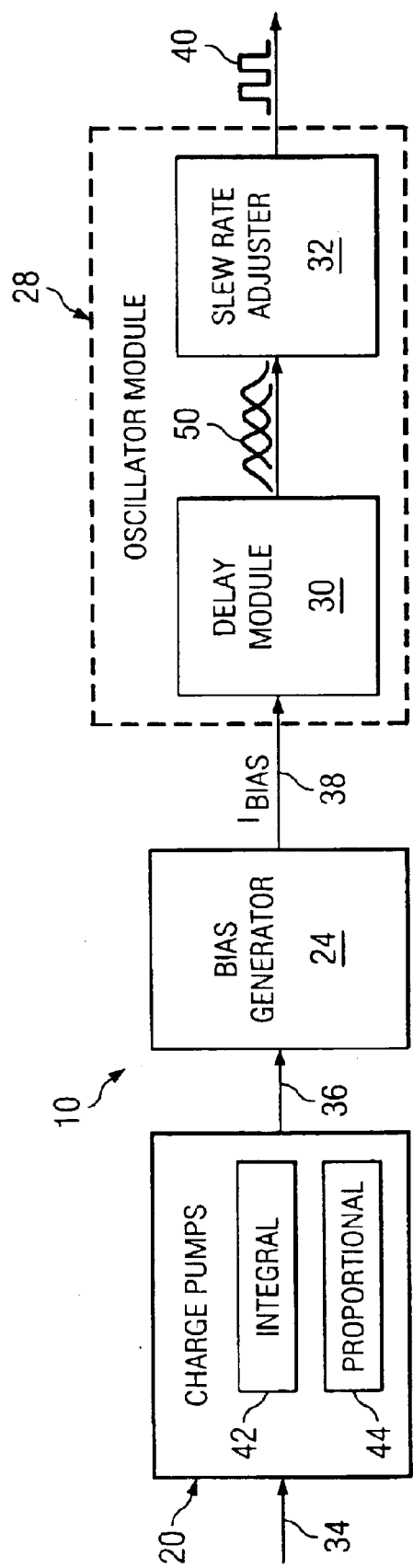
FIG. 1 is a block diagram of one embodiment of a system for generating an oscillating signal that may be used in accordance with the present invention.

FIG. 1 is a block diagram of one embodiment of a system 10 comprising a current controlled oscillator for generating an oscillating signal. The system may include transistor sets that form a differential delay element and operate to generate substantially symmetrical differential signals. The substantially symmetrical differential signals may be used to generate an oscillating signal with a specific oscillation frequency.

According to the illustrated embodiment, system 10 includes charge pumps 20, a bias generator 24, and an oscillator module 28 that includes a delay module 30 and a slew rate adjuster 32. According to one embodiment of operation, charge pumps 20 provide control information 36 corresponding to an oscillation frequency to bias generator 24. Bias generator 24 supplies a control current 38 formed according to the control information 36 to oscillator module 26. Oscillator module 28 generates the oscillating signal 40 having the oscillation frequency.

According to the embodiment, charge pumps 20 receive input 34. Input 34 may comprise a voltage or a current that corresponds to the oscillation frequency of the oscillating signal 40. Input 34 may be adjusted to generate specific control information 36 that yields a specific control current 38 that may result in an oscillating signal 40 having a specific frequency. Charge pumps 20 may comprise, for example, an integral charge pump 42 and a proportional charge pump 44. Charge pumps 20 may, however, include any suitable charge pumps that may be used to provide control information 36 to bias generator 24.

According to the embodiment, charge pumps 20 may generate control information 36 in response to input 34. Integral charge pump 42 may generate an integral current in response to input 34. An integral current may comprise an integral of the control current. Proportional charge pump 44 may generate a proportional current in response to input 34. A proportional current may comprise a current proportional to a frequency error associated with the oscillation frequency. Input 34 into integral charge pump 42, into proportional charge pump 44, or both may be adjusted in order to generate specific control information 36.

Bias generator 24 generates control current 38 in response to control information 36. Control current 38 may comprise a current that corresponds to the oscillation frequency, and is operable to generate an oscillation signal having approximately the oscillation frequency. For example, control current 38 may comprise a bias current generated from integral current and proportional current. The frequency of oscillating signal 40 may be adjusted using control current 38.

Oscillator module 28 generates oscillating signal 40 in response to control current 38. Delay module 30 generates differential signals 50 having a frequency that corresponds to control current 38. A differential signal 50 comprises a signal having a frequency substantially similar to the oscillation frequency, and may be used to generate oscillating signal 40. Delay module 30 may include transistor sets that operate in conjunction with each other to generate substantially symmetrical differential signals 50. Slew rate adjuster 32 determines slew points of differential signals 50 and transforms one or more differential signals 50 into one or more oscillating signals 40. An oscillating signal 40 may comprise a signal having the oscillation frequency. Oscillating signal 40 may have, for example, a substantially square waveform.

System 10 may be used with any suitable application. For example, system 10 may be used with low power, high performance digital signal processing (DSP) cores, low power wireless application specific integrated circuits (ASICs), low power SERDES interfaces, or any other suitable application.

Modifications, additions, or omissions may be made to system 10 without departing from the scope of the invention. For example, system 10 may have more, fewer, or other modules. Moreover, the operations of system 10 may be performed by more, fewer, or other modules. For example, the operations of delay module 30 and slew rate adjuster 32 may be performed by one module, or the operations of delay module 30 may be performed by more than one module. Additionally, functions may be performed using any suitable logic comprising software, hardware, other logic, or any suitable combination of the preceding.

Figure 2A:
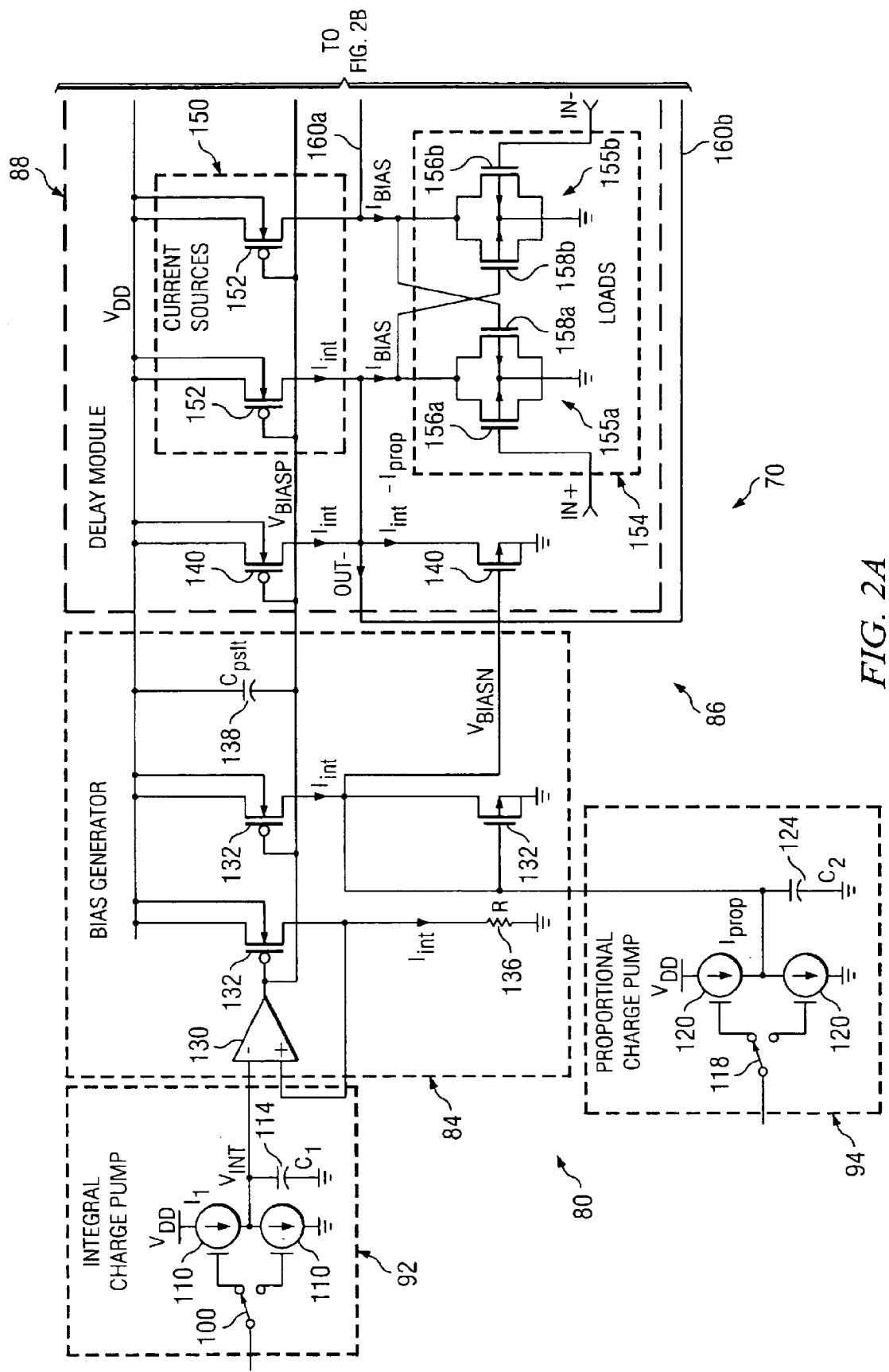
FIG. 2 is a circuit diagram illustrating one embodiment of a system for generating an oscillating signal.
Figure 2B:
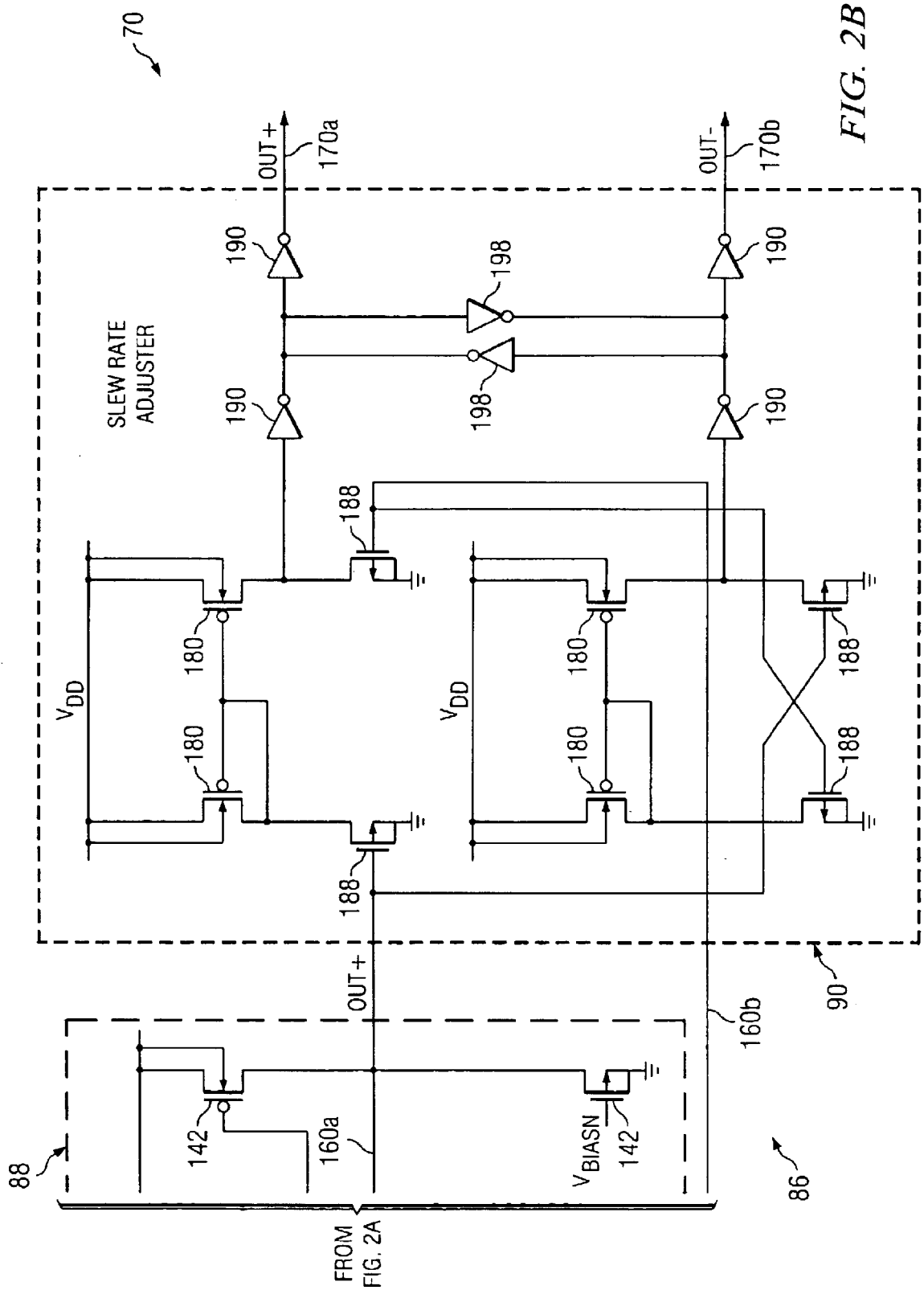

FIG. 2 is a circuit diagram illustrating one embodiment a system 70 comprising a current controlled oscillator for generating an oscillating signal. According to the illustrated embodiment, system 70 includes charge pumps 80, a bias generator 84, and an oscillator module 86 comprising a delay module 88 and a slew rate adjuster 90 coupled as illustrated. According to the embodiment, charge pumps 80 generate control information corresponding to an oscillation frequency of an oscillation signal. According to the embodiment, charge pumps 80 include an integral charge pump 92 and a proportional charge pump 94.

Integral charge pump 92 generates an integral current in response to input. According to the illustrated embodiment, integral charge pump 92 includes a switch 100, up/down pump current sources 110, and a capacitor 114 coupled as illustrated. Integral current $I_{int}$ may be described by Equation (1):

$$I_{int} = \frac{\int I_1 \cdot dt}{RC_1} \quad (1)$$

where $I_1$ represents a current associated with control voltage drain $V_{int}$, R represents the resistance of a resistor 136 of bias generator 84, and $C_1$ represents the capacitance of capacitor 114.

Proportional charge pump 94 generates a proportional current in response to input. According to the illustrated embodiment, proportional charge pump 94 includes a switch 118, up/down pump current sources 120, and a capacitor 124 coupled as illustrated. Proportional current $I_{prop}$ may be described by Equation (2)

$$I_{prop} \propto \Delta\omega_{ERR} = \omega_{ERR} \cdot \text{sign}(\omega_{ERR}) \quad (2)$$

where $\omega_{ERR} = \omega_1 - \omega_0$ represents the frequency error of the oscillation frequency of the oscillating signals, and sign function $\text{sign}(x)=1$ for $x \geq 0$ and $\text{sign}(x)=-1$ for $x<0$.

Bias generator 84 generates a control current from control information received from charge pumps 80. Control information may include integral and proportional currents and a control voltage. The control voltage may be used to generate an oscillating signal having a specific oscillation frequency. According to the illustrated embodiment, bias generator 84 may include an amplifier 130, transistors 132, a resistor 136, and a capacitor 138 coupled as illustrated. The control current may comprise a bias current $I_{BIAS}$ calculated according to $I_{BIAS}=I_{int}+I_{int}-(I_{int}-I_{prop})$. The negative sign of $(I_{int}-I_{prop})$ may be generated by an intentional inversion of the charge pump control inputs. Thus, the charge pumps may operate in opposing phaese. According to the illustrated embodiment, bias current $I_{BIAS}$ may be generated according to Equation (3):

$$I_{BIAS} = f\left(\frac{\int I_1 \cdot dt}{RC_1}, I_{prop}\right) \quad (3)$$

$$= \frac{\int I_1 \cdot dt}{RC_1} \cdot \frac{g_m + 2s \cdot C_2}{g_m + s \cdot C_2} + I_{prop} \cdot \frac{g_m}{g_m + s \cdot C_2}$$

where $g_m$ represents transconductance of the diode connected MOSFET, s represents the frequency $J\omega$, and $C_2$ represents the capacitance of capacitor 124. According to one embodiment, capacitance $C_2$ may be approximately $\frac{1}{20}$ of the capacitance $C_1$.

Delay module 88 generates differential signals 160 that may be used to generate the oscillating signal. The delay through delay module 88 may be controlled by the control voltage comprising bias voltage $V_{BIAS}$. According to the illustrated embodiment, delay module 88 includes transistors 140 and 142, current sources 150, and loads 154 coupled as illustrated. Current sources 150 include transistors 152 coupled as illustrated. A current source 150 sets the control current.

A load 22 generates differential signals 160 in accordance with the control current. According to the illustrated embodiment, loads 154 include transistor sets 155 comprising transistor pairs with transistors 156 and 158 coupled as illustrated. As an example, a first transistor set 155a comprises a transistor pair having transistors 156a and 158a, and a second transistor set 155b comprises a transistor pair having transistors 156b and 158b. A transistor refers to a device capable of amplification, oscillation, and switching operations. For example, a transistor may comprise an N-type metal-oxide-semiconductor field-effect transition (MOSFET). The DC gain of delay module 88 may be controlled by the ratio of transistors 156a and 158a.

Transistor sets 155 may operate in opposition to each other such that if input into one transistor set 155 is high, the input into the other transistor set 155 is low. Transistor sets 155 may operate in opposition to generate differential signal in opposition that are 180 degrees out of phase. According to the illustrated embodiment, if input IN+ into transistor set 155a is high, then transistor set 155b decreases input IN−, which produces symmetrical differential signals. If a control current comprising bias current $I_{Bias}$ is higher, then loads 154 switch faster, and if bias current $I_{Bias}$ is lower, then loads 154 switch more slowly. Accordingly, bias current may be used to control the frequency of the signals generated by loads 154.

Slew rate adjuster 90 transforms differential signals 160 into oscillating signals 170 such as square waveform signals. Examples of differential signals 160 and oscillating signals 170 are described in more detail with reference to FIG. 3.

Figure 3:
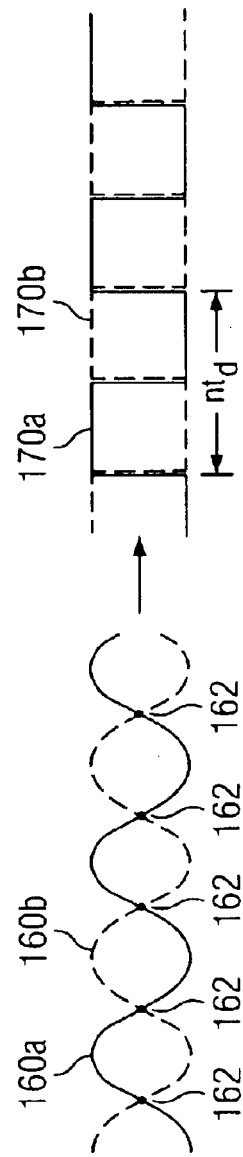
FIG. 3 illustrates examples of differential signals that may be transformed into oscillating signals.

FIG. 3 illustrates examples of differential signals 160 that may be transformed into oscillating signals 170 by slew rate adjuster 90. Differential signal 160a is transformed into oscillating signal 170a, and differential signal 160b is transformed into oscillating signal 170b. Slew rate adjuster 90 may transform differential signals 160 by identifying slew points 162 of differential signals 160. A slew points 162 may be identified as an intersection between differential signals 160a–b. Slew rate adjuster 90 may increase the slope at slew points 162 to a substantially vertical slope in order to generate square waveform oscillating signals 170. According to the illustrated example, oscillating signals 170 comprise substantially square waveform signals having a 50 percent duty cycle. According to one embodiment, the resulting 50 percent duty cycle may be relatively accurate.

A period of oscillating signal 170 may have a duration of $nt_d$, where n represents the number of stages and $t_d$ represents the time delay of each stage. A stage refers to entities that operate to generate differential signals and to transform the differential signals to an oscillating signal. A stage may comprise, for example, a oscillator module 86 comprising a delay module 88 and a slew rate adjuster 90. An example of a multi-stage system is described with reference to FIG. 5.

The time delay $t_D$ may be approximated according to Equation (4):

$$t_D \approx \frac{\alpha \cdot C_L \cdot \Delta V_{swing}}{I_{bias}} \quad (4)$$

where $t_D$ represents delay from a single delay stage, α represents a correction factor for linearity, $C_L$ represents the load capacitance of a single delay stage, and $V_{swing}$ represents total voltage swing at the output node.

Referring back to FIG. 2, slew rate adjuster 90 may include transistors 180 and 188 and inverters 190 and 198 coupled as illustrated. Slew rate adjuster 90 may convert differential signals 162 into oscillating signals 170 comprising high slew rate rail-to-rail signals that retain the approximately 50 percent duty cycles of the internal nodes. Oscillating signals 170 may have frequencies in the range of 10 MHz to 5 GHz.

System 70 may be scaled provide different frequencies for different supply voltages $V_{DD}$. Example frequencies that may be provided for example drain voltages include: 400 MHz to 80 MHz for $V_{DD}$=0.6 V; 1.5 GHz to 300 MHz for $V_{DD}$=0.8 V; 2.5 GHz to 500 MHz for $V_{DD}$=0.9 V; and 3.0 GHz to 800 MHz for $V_{DD}$=0.9 V. System 70 may be configured for high performance low powered applications. Examples of frequencies that might be provided at example powers include 3 GHz at ~7 mW and 500 MHz at ~360 uW.

Modifications, additions, or omissions may be made to system 70 without departing from the scope of the invention. For example, system 70 may have more, fewer, or other modules. Moreover, the operations of system 70 may be performed by more, fewer, or other modules. For example, the operations of delay module 88 and slew rate adjuster 90 may be performed by one module, or the operations of delay module 88 may be performed by more than one module. Additionally, functions may be performed using any suitable logic comprising software, hardware, other logic, or any suitable combination of the preceding.

Certain embodiments of system 70 may provide one or more technical advantages. A technical advantage of one embodiment may be that system 70 may have reduced power supply requirements even for high frequency operation. Another technical advantage of one embodiment may be that the gain of system 70 may be independent of the temperature of operation and process variation. Yet another advantage of one embodiment may be that the gain of system 70 may be constant for a wide range of frequency operation. Yet another advantage of one embodiment may be that system 70 may be more effectively integrated in phase lock loop designs and other similar circuits. Yet another advantage of one embodiment may be that the size and power consumption of system 70 may be smaller than those of devices using LC components.

Figure 4:
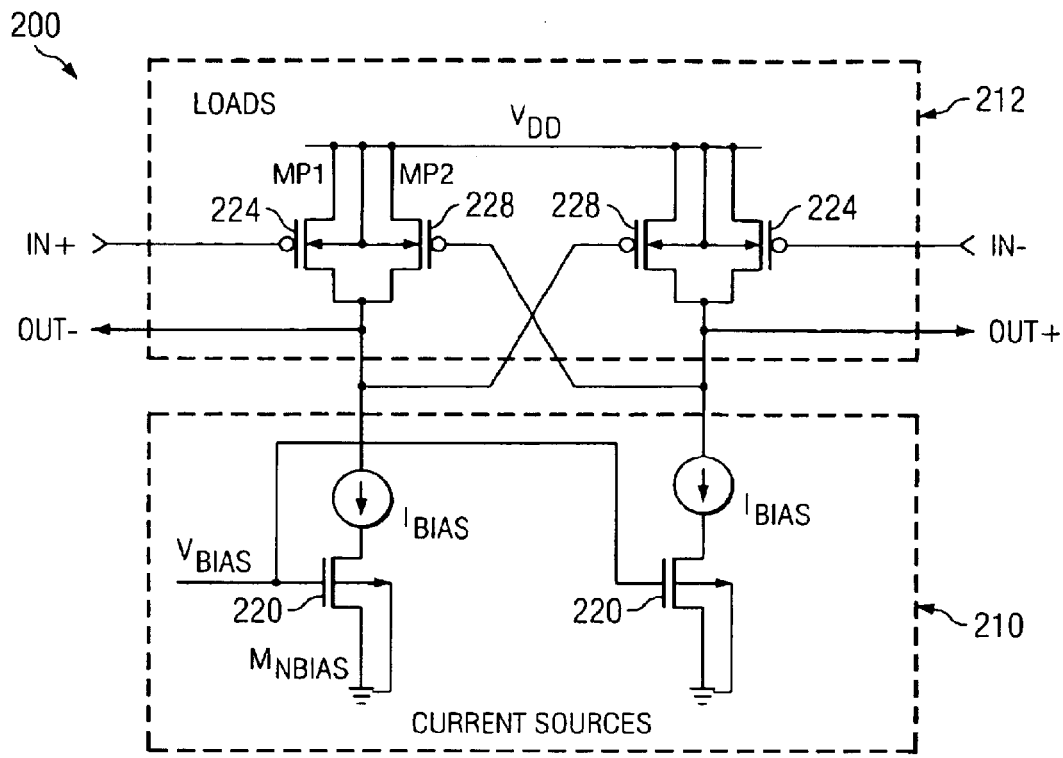
FIG. 4 is a circuit diagram of one embodiment of a delay module.

FIG. 4 is a circuit diagram of another embodiment of a delay module 200 of an oscillator module. According to the illustrated embodiment, delay module 200 includes current sources 210 and loads 212. Current sources 210 include transistors 220 coupled to transistors 224 and 228 of loads 212 as illustrated. Loads 212 may comprise transistors such as P-type MOSFETs. Delay module 200 may be used in system 70 of FIG. 2, where the devices of system 70 are replaced with complimentary devices.

Modifications, additions, or omissions may be made to delay module 200 without departing from the scope of the invention. For example, delay module 200 may have more, fewer, or other modules. Moreover, the operations of delay module 200 may be performed by more, fewer, or other modules. For example, the operations of current sources 210 and loads 212 may be performed by one module, or the operations of loads 212 may be performed by more than one module. Additionally, functions may be performed using any suitable logic comprising software, hardware, other logic, or any suitable combination of the preceding.

Figure 5:
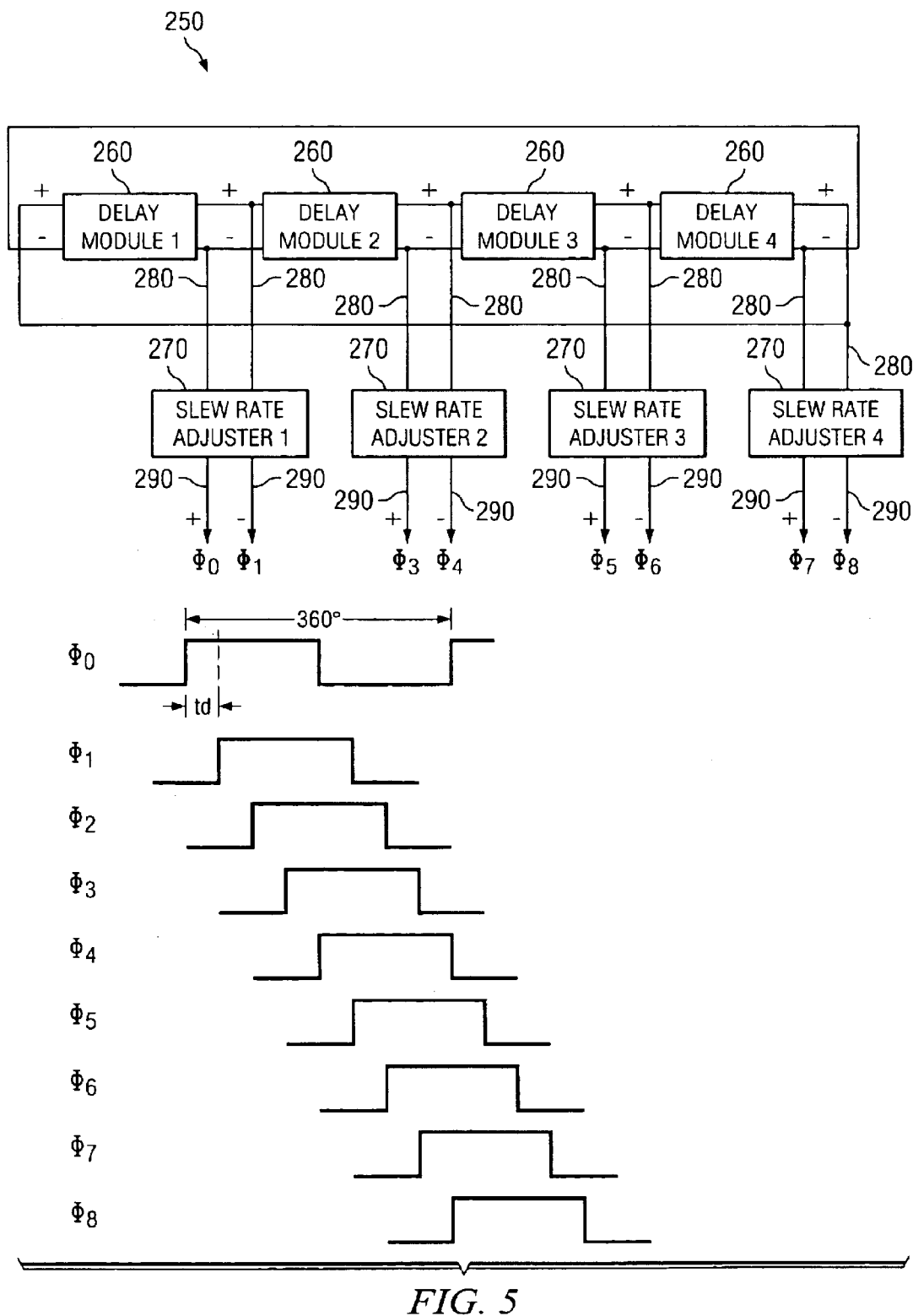
FIG. 5 is a block diagram of one embodiment of a multi-stage oscillator module for generating an oscillating signal.

FIG. 5 is a block diagram of one embodiment of a multi-stage oscillator module 250 for generating an oscillating signal. According to the illustrated embodiment, multi-stage oscillator module 250 includes delay modules 260 and slew rate adjusters 270 coupled as illustrated. Although multi-stage oscillator module 250 is illustrated as having four delay modules 260 and four slew rate adjusters 270, multi-stage oscillator module 250 may include any suitable number of delay modules 260 and slew rate adjusters 270, such as eight delay modules 260 and eight slew rate adjusters 270.

According to one embodiment, a stage includes a delay module 260 and a corresponding slew rate adjuster 270. A delay module 260 generates a positive differential signal and a negative differential signal, which are transformed into positive and negative signals 290 respectively, by the corresponding slew rate adjuster 270. Accordingly, n stages may generate two n signals. According to the embodiment, the oscillating signals 290 may have different phases. A phase $\Phi_i$ of a signal 290 may be offset by a delay time $t_d$ from a phase $\Phi_{i+1}$ of a next signal 290. The delay time may represent the delay introduced by a delay module 260, which may be calculated according to Equation (4). For an n-stage system 250, $n \times t_d = 360°$.

Modifications, additions, or omissions may be made to oscillator module 250 without departing from the scope of the invention. For example, oscillator module 250 may have more, fewer, or other modules. Moreover, the operations of oscillator module 250 may be performed by more, fewer, or other modules. For example, the operations of delay module 260 and slow rate adjuster 270 may be performed by one module, or the operations of delay module 260 may be performed by more than one module. Additionally, functions may be performed using any suitable logic comprising software, hardware, other logic, or any suitable combination of the preceding.

Figure 6:
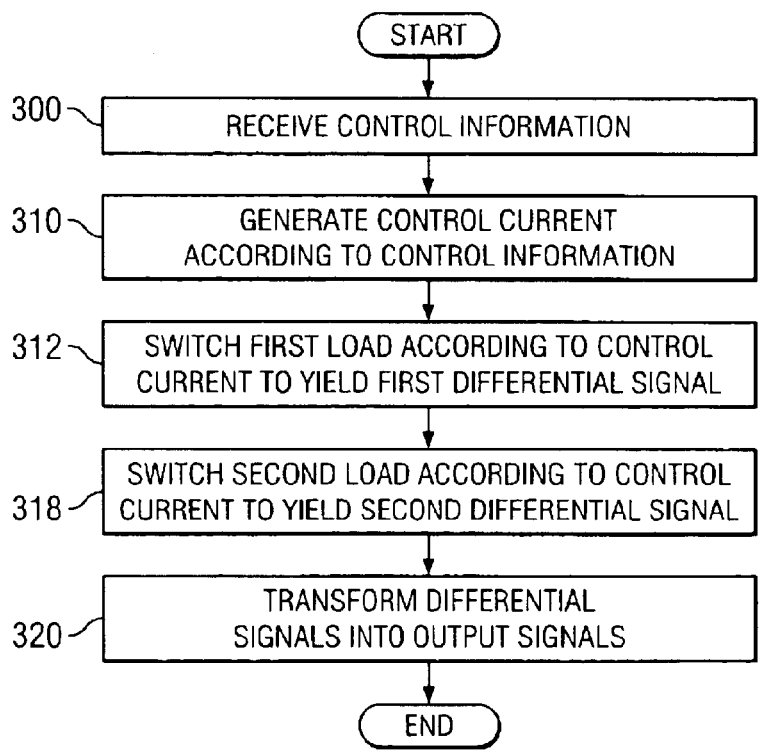
FIG. 6 is a flowchart demonstrating one embodiment of a method for generating an oscillating signal that may be used in accordance with the present invention.

FIG. 6 is a flowchart demonstrating one embodiment of a method for generating an oscillating signal that may be used in accordance with the present invention. The method may be used with any suitable system. For illustration purposes, the method is described using system 70 of FIG. 2. The method begins at step 300, where bias generator 84 receives control information. The control information may comprise a control voltage and integral and proportional currents. Bias generator 84 generates a control current according to the control information at step 310.

A first load is switched according to the control current to yield a first differential signal 160a at step 312. The first load may comprise transistors 156a and 158a. A second load is switched according to the control current to yield a second differential signal 160b at step 318. The second load may comprise transistors 156b and 158b, which decrease in response to the increase at transistors 156a and 158a. Slew rate adjuster 90 transforms differential signals 160 into output oscillating signals 170 at step 320. After transforming differential signals 160, the method terminates.

Modifications, additions, or omissions may be made to the method without departing from the scope of the invention. Additionally, steps may be performed in any suitable order without departing from the scope of the invention.

Certain embodiments of the invention may provide one or more technical advantages. A technical advantage of one embodiment may be that transistor sets may operate to generate substantially symmetrical differential signals. The substantially symmetrical differential signals may be used to generate an oscillating signal with an accurate 50 percent duty cycle while providing the capability to be generated at as low as 0.5 V.

Although an embodiment of the invention and its advantages are described in detail, a person skilled in the art could make various alterations, additions, and omissions without departing from the spirit and scope of the present invention as defined by the appended claims.

What is claimed is:

1. A method for generating an oscillating signal according to a control current, comprising:
  receiving a control current corresponding to an oscillation frequency;
  generating one or more first differential signals and one or more second differential signals by performing the following for each stage of one or more stages:
    switching a first load according to the control current to yield the first differential signal, the first load comprising at least a first set of transistors; and
    switching a second load according to the control current to yield the second differential signal, the second load comprising at least a second set of transistors coupled to the first set of transistors, the first set of transistors operating in opposition to the second set of transistors; and
  generating the oscillating signal in accordance with the one or more first differential signals and the one or more second differential signals, the oscillating signal having a frequency substantially proportional to the oscillation frequency.

2. The method of claim 1, further comprising:
  receiving a control voltage, the control voltage corresponding to the oscillation frequency; and
  generating the control current according to the control voltage.

3. The method of claim 1, further comprising:
  receiving input corresponding to the oscillation frequency; and
  generating the control current according to the input by:
    receiving an integral current comprising an integral of the control current;
    receiving a proportional current proportional to a frequency error associated with the oscillation frequency; and
    summing the integral current and the proportional current to yield the control current.

4. The method of claim 1, wherein switching the first load according to the control current to yield the first differential signal further comprises introducing a delay according to the control current.

5. The method of claim 1, wherein generating the oscillating signal in accordance with the one or more first differential signals and the one or more second differential signals further comprises transforming a waveform of a first differential signal of a stage to a square waveform having an approximately fifty percent duty cycle.

6. The method of claim 1, wherein generating the oscillating signal in accordance with the one or more first differential signals and the one or more second differential signals further comprises transforming a waveform of a first differential signal of a stage to a square waveform by:
  identifying a plurality of slew points of the first differential signal, a slew point comprising an intersection between the first differential signal and a second differential signal of the stage; and
  increasing a slope at each slew point of the first differential signal.

7. The method of claim 1, wherein:
  the first differential signal has a substantially square waveform with a fifty percent duty cycle; and
  the second differential signal has a substantially square waveform with a fifty percent duty cycle.

8. A system for generating an oscillating signal according to a control current, comprising:
  a delay module operable to:
    receive a control current corresponding to an oscillation frequency;
    generate one or more first differential signals and one or more second differential signals by performing the following for each stage of one or more stages:
      switch a first load according to the control current to yield the first differential signal, the first load comprising at least a first set of transistors; and
      switch a second load according to the control current to yield the second differential signal, the second load comprising at least a second set of transistors coupled to the first set of transistors, the first set of transistors operating in opposition to the second set of transistors; and
  a slew rate adjuster coupled to the delay module and operable to generate the oscillating signal in accordance with the one or more first differential signals and the one or more second differential signals, the oscillating signal having a frequency substantially proportional to the oscillation frequency.

9. The system of claim 8, further comprising a bias generator coupled to the delay module and operable to:
  receive a control voltage, the control voltage corresponding to the oscillation frequency; and
  generate the control current according to the control voltage.

10. The system of claim 8, further comprising a bias generator coupled to the delay module and operable to:
  receive input corresponding to the oscillation frequency; and
  generate the control current according to the input by:
    receiving an integral current comprising an integral of the control current;
    receiving a proportional current proportional to a frequency error associated with the oscillation frequency; and
    summing the integral current and the proportional current to yield the control current.

11. The system of claim 8, wherein the delay module is operable to switch the first load according to the control current to yield the first differential signal by introducing a delay according to the control current.

12. The system of claim 8, wherein the slew rate adjuster is operable to generate the oscillating signal in accordance with the one or more first differential signals and the one or more second differential signals by transforming a waveform of a first differential signal of a stage to a square waveform having an approximately fifty percent duty cycle.

13. The system of claim 8, wherein the slew rate adjuster is operable to generate the oscillating signal in accordance with the one or more first differential signals and the one or more second differential signals by transforming a waveform of a first differential signal of a stage to a square waveform by:
  identifying a plurality of slew points of the first differential signal, a slew point comprising an intersection between the first differential signal and a second differential signal of the stage; and
  increasing a slope at each slew point of the first differential signal.

14. The system of claim 8, wherein:
  the first differential signal has a substantially square waveform with a fifty percent duty cycle; and
  the second differential signal has a substantially square waveform with a fifty percent duty cycle.

15. A system for generating an oscillating signal according to a control current, comprising:
  a delay module operable to:
    receive a control current corresponding to an oscillation frequency;
    generate one or more first differential signals and one or more second differential signals by performing the following for each stage of one or more stages:
      switch a first load according to the control current to yield the first differential signal by introducing a delay according to the control current, the first load comprising at least a first set of transistors, the first differential signal having a substantially square waveform with a fifty percent duty cycle; and
      switch a second load according to the control current to yield the second differential signal, the second load comprising at least a second set of transistors coupled to the first set of transistors, the first set of transistors operating in opposition to the second set of transistors, the second differential signal having a substantially square waveform with a fifty percent duty cycle; and
  a slew rate adjuster coupled to the delay module and operable to generate the oscillating signal in accordance with the one or more first differential signals and the one or more second differential signals, the oscillating signal having a frequency substantially proportional to the oscillation frequency.

16. The system of claim 15, further comprising a bias generator coupled to the delay module and operable to:
  receive a control voltage, the control voltage corresponding to the oscillation frequency; and
  generate the control current according to the control voltage.

17. The system of claim 15, further comprising a bias generator coupled to the delay module and operable to:
  receive input corresponding to the oscillation frequency; and
  generate the control current according to the input by:
    receiving an integral current comprising an integral of the control current;
    receiving a proportional current proportional to a frequency error associated with the oscillation frequency; and
    summing the integral current and the proportional current to yield the control current.

18. The system of claim 15, wherein the slew rate adjuster is operable to generate the oscillating signal in accordance with the one or more first differential signals and the one or more second differential signals by transforming a waveform of a first differential signal of a stage to a square waveform by:
  identifying a plurality of slew points of the first differential signal, a slew point comprising an intersection between the first differential signal and a second differential signal of the stage; and
  increasing a slope at each slew point of the first differential signal.

19. A system for generating an oscillating signal according to a control current, comprising:
  means for receiving a control current corresponding to an oscillation frequency;
  means for generating one or more first differential signals and one or more second differential signals by performing the following for each stage of one or more stages:
    switching a first load according to the control current to yield the first differential signal, the first load comprising at least a first set of transistors; and
    switching a second load according to the control current to yield the second differential signal, the second load comprising at least a second set of transistors coupled to the first set of transistors, the first set of transistors operating in opposition to the second set of transistors; and
  means for generating the oscillating signal in accordance with the one or more first differential signals and the one or more second differential signals, the oscillating signal having a frequency substantially proportional to the oscillation frequency.

20. A method for generating an oscillating signal according to a control current, comprising:
  receiving input corresponding to an oscillation frequency;
  generating a control current corresponding to the oscillation frequency by:
    receiving an integral current comprising an integral of the control current;

receiving a proportional current proportional to a frequency error associated with the oscillation frequency; and summing the integral current and the proportional current to yield the control current;

generating one or more first differential signals and one or more second differential signals by performing the following for each stage of one or more stages:

switching a first load according to the control current to yield the first differential signal by introducing a delay according to the control current, the first load comprising at least a first set of transistors, the first differential signal having a substantially square waveform with a fifty percent duty cycle; and switching a second load according to the control current to yield the second differential signal, the second load comprising at least a second set of transistors coupled to the first set of transistors, the first set of transistors operating in opposition to the second set of transistors, the second differential signal having a substantially square waveform with a fifty percent duty cycle; and generating the oscillating signal in accordance with the one or more first differential signals and the one or more second differential signals, the oscillating signal having a frequency substantially proportional to the oscillation frequency, the oscillating signal generated by transforming a waveform of a first differential signal of a stage to a square waveform having an approximately fifty percent duty cycle by:

identifying a plurality of slew points of the first differential signal, a slew point comprising an intersection between the first differential signal and a second differential signal of the stage; and increasing a slope at each slew point of the first differential signal.

* * * * *